(12) United States Patent
Mu

(10) Patent No.: US 12,205,893 B2
(45) Date of Patent: Jan. 21, 2025

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Tianlei Mu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/612,546

(22) PCT Filed: Jun. 30, 2021

(86) PCT No.: PCT/CN2021/103881
§ 371 (c)(1),
(2) Date: Nov. 18, 2021

(87) PCT Pub. No.: WO2022/179028
PCT Pub. Date: Sep. 1, 2022

(65) Prior Publication Data
US 2023/0402372 A1 Dec. 14, 2023

(30) Foreign Application Priority Data
Feb. 25, 2021 (CN) .......................... 202110214102.3

(51) Int. Cl.
*H01L 23/52* (2006.01)
*H01L 21/768* (2006.01)
*H01L 23/528* (2006.01)

(52) U.S. Cl.
CPC ...... *H01L 23/528* (2013.01); *H01L 21/76814* (2013.01); *H01L 21/76831* (2013.01); *H01L 21/76843* (2013.01)

(58) Field of Classification Search
CPC .............. H10B 12/485; H10B 12/0335; H10B 12/482; H10B 12/315; H10B 12/033
See application file for complete search history.

(56) References Cited

U.S. PATENT DOCUMENTS 8,581,337 B2 11/2013 Kye et al.
2006/0099786 A1 5/2006 Fan et al.
(Continued)

FOREIGN PATENT DOCUMENTS

CN 1627504 A 6/2005
CN 113035868 A 6/2021

OTHER PUBLICATIONS

International Search Report in Application No. PCT/CN2021/103881, mailed on Dec. 1, 2021.

*Primary Examiner* — Tony Tran
(74) *Attorney, Agent, or Firm* — Syncoda LLC; Feng Ma

(57) ABSTRACT

A method for forming a semiconductor structure includes: providing a substrate, and forming a dielectric layer and a mask layer, where the mask layer is arranged with a first opening; forming a first barrier layer on a sidewall of the first opening, where the first barrier layer surrounds and forms a second opening; forming a second barrier layer filling the second opening; removing the first barrier layer and the second barrier layer by a first etching process until the first barrier layer or the second barrier layer is completely removed; and removing the dielectric layer exposed by the first opening and part of the substrate exposed by the first opening to form a bit-line contact opening.

8 Claims, 13 Drawing Sheets

(56) References Cited

U.S. PATENT DOCUMENTS

2012/0007258 A1* 1/2012 Oh ..................... H01L 29/7827
                                                            438/653
2022/0367667 A1* 11/2022 Cheng ................ H01L 29/0847

* cited by examiner

METHOD FOR FORMING SEMICONDUCTOR STRUCTURE AND SEMICONDUCTOR STRUCTURE

CROSS-REFERENCE TO RELATED APPLICATIONS

This application is a national stage of International Application No. PCT/CN2021/103881 filed on Jun. 30, 2021, which claims priority to Chinese Patent Application No. 202110214102.3, filed on Feb. 25, 2021. The disclosures of the above-referenced applications are hereby incorporated by reference in their entirety.

TECHNICAL FIELD

The present disclosure relates to, but is not limited to, a method for forming a semiconductor structure and a semiconductor structure.

BACKGROUND

As the line width of the dynamic random access memory (DRAM) gradually decreases, the size of the bit-line structure to be formed decreases, resulting in a decrease in the size of the bit-line contact structure to be formed. The decrease in the size of the bit-line contact structure leads to an increase in the contact resistance of the bit-line contact structure, thereby affecting the electrical performance of the subsequently formed semiconductor structure and reducing the yield of the semiconductor structure.

It is urgently necessary to decrease the contact resistance of the bit-line contact structure under the context of the decrease in the size of the bit-line contact structure.

SUMMARY

An overview of the subject matter detailed in the present disclosure is provided below, which is not intended to limit the protection scope of the claims.

Embodiments of the present disclosure provide a method for forming a semiconductor structure and a semiconductor structure.

A first aspect of an embodiment of the present disclosure provides a method for forming a semiconductor structure. The method for forming a semiconductor structure includes: providing a substrate, and forming a dielectric layer on a surface of the substrate; forming a mask layer on a surface of the dielectric layer, where the mask layer is arranged with a first opening penetrating the mask layer in a thickness direction of the mask layer; forming a first barrier layer on a sidewall of the first opening, where the first barrier layer surrounds and forms a second opening; forming a second barrier layer filling the second opening; removing the first barrier layer and the second barrier layer by a first etching process until the first barrier layer or the second barrier layer is completely removed, where the removed rate of the first barrier layer by the first etching process is different from the removed rate of the second barrier layer by the first etching process; and removing the dielectric layer exposed by the first opening and part of the substrate exposed by the first opening to form a bit-line contact opening, where the bottom of the bit-line contact opening is arranged with a convex region and a concave region, and the convex region and the concave region have a height difference.

A second aspect of the present disclosure provides a semiconductor structure. The semiconductor structure includes: a substrate, where the substrate is arranged with active areas and first contact openings exposing the active areas; a bottom of each of the first contact openings is arranged with a first area and a second area, and the first area and the second area have a height difference; and a dielectric layer located on a surface of the substrate, where the dielectric layer is arranged with second contact openings penetrating the dielectric layer; each of the second contact openings exposes the first contact opening; the second contact opening and the first contact opening define a bit-line contact opening.

In the embodiment of the present disclosure, the bit-line contact opening is arranged with a concave region and a convex region, which increase the bottom area of the bit-line contact opening. In this way, the contact area of the bit-line contact structure formed subsequently by filling the bit-line contact opening is increased, thereby reducing the contact resistance of the bit-line contact structure formed subsequently.

Other aspects of the present disclosure are understandable upon reading and understanding the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings according to these drawings without creative efforts.

Figure 1:
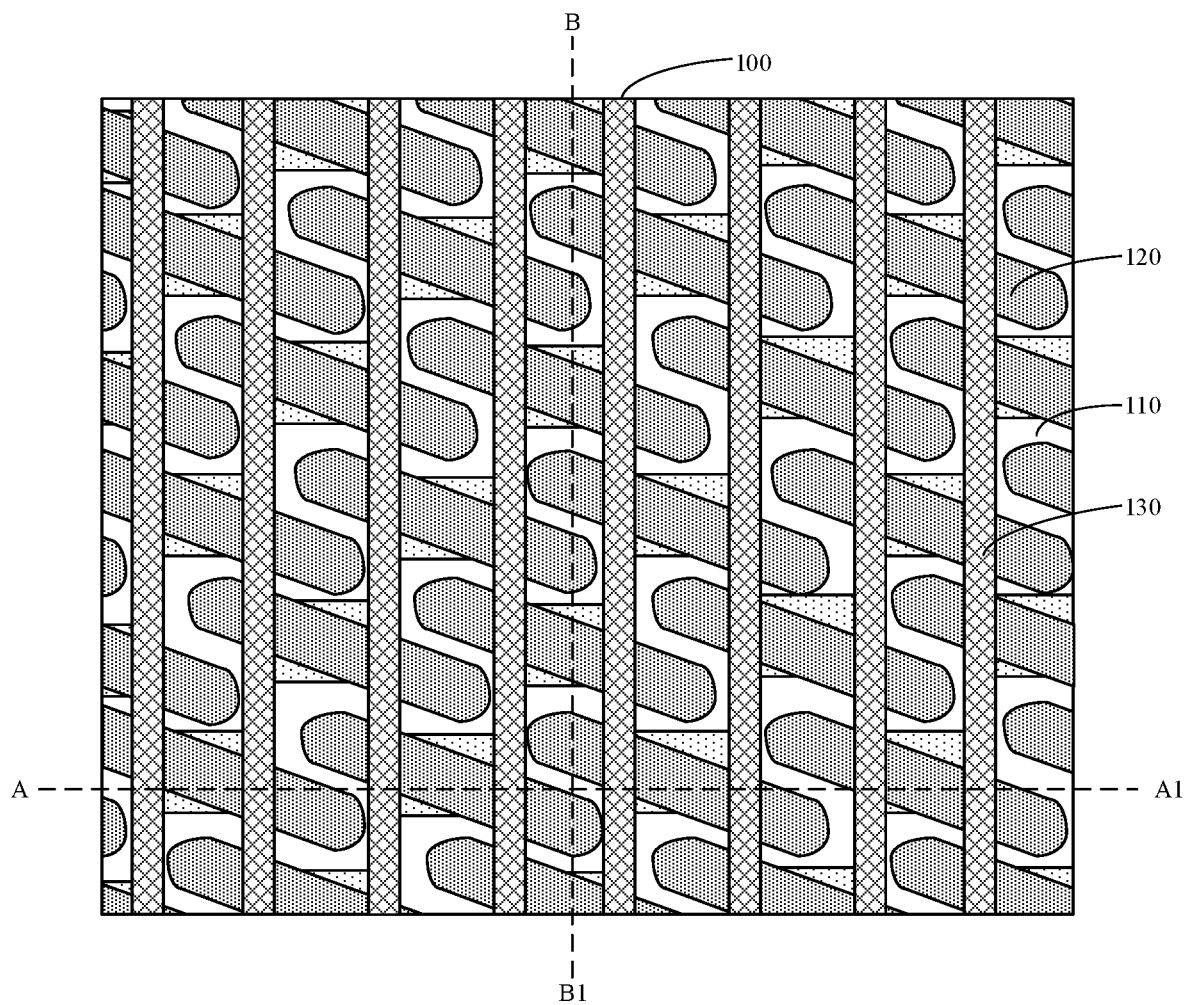
FIG. 1 is a top view of a substrate according to a first embodiment of the present disclosure.

REFERENCE NUMERALS 100. substrate; 110. shallow trench isolation (STI) structure; 120. active area; 130. word-line structure;
101. dielectric layer; 102. mask layer; 103. first barrier layer; 104. second barrier layer; 105. bit-line contact opening; 112. first opening; 122. second opening; 115. convex region; 125. concave region.

DETAILED DESCRIPTION

As the line width of the dynamic random access memory (DRAM) gradually decreases, the size of the bit-line structure to be formed decreases, resulting in a decrease in the size of the bit-line contact structure to be formed. The decrease in the size of the bit-line contact structure leads to an increase in the contact resistance of the bit-line contact structure, thereby affecting the electrical performance of the subsequently formed semiconductor structure and reducing the yield of the semiconductor structure.

A first embodiment of the present disclosure provides a method for forming a semiconductor structure. The method for forming a semiconductor structure includes: provide a substrate, and form a dielectric layer on a surface of the substrate; form a mask layer on a surface of the dielectric layer, where the mask layer is arranged with a first opening penetrating the mask layer in a thickness direction of the mask layer; form a first barrier layer on a sidewall of the first opening, where the first barrier layer surrounds and forms a second opening; form a second barrier layer filling the second opening; remove the first barrier layer and the second barrier layer by a first etching process until the first barrier layer or the second barrier layer is completely removed, where the removed rate of the first barrier layer by the first etching process is different from the removed rate of the second barrier layer by the first etching process; and remove the dielectric layer exposed by the first opening and part of the substrate exposed by the first opening to form a bit-line contact opening, where the bottom of the bit-line contact opening is arranged with a convex region and a concave region, and the convex region and the concave region have a height difference.

In order to make the objectives, technical solutions and advantages of the embodiments of the present disclosure clearer, the embodiments of the present disclosure are described below with reference to the drawings. Those skilled in the art should understand that many technical details are proposed in the embodiments of the present disclosure to make the present disclosure better understood. However, even without these technical details and various changes and modifications made according to the following embodiments, the technical solutions claimed in the present disclosure may still be realized. The following divisions of the various embodiments are intended for convenience of description, and are not intended to constitute any limitation to the specific implementation of the present disclosure. The various embodiments may be combined with each other in case of no contradiction.

FIG. 1 is a top view of a substrate according to the first embodiment of the present disclosure. FIGS. 2, 4, 6, 8, 10, 12, 14, 16, 18, 20, 22 and 24 are sectional views taken along AA1 direction, illustrating structures obtained by implementing various steps of a method for forming a semiconductor structure according to the first embodiment of the present disclosure. FIGS. 3, 5, 7, 9, 11, 13, 15, 17, 19, 21, 23 and 25 are sectional views taken along BB1 direction, illustrating structures obtained by implementing various steps of the method for forming a semiconductor structure according to the first embodiment of the present disclosure. The method for forming a semiconductor structure according to the first embodiment of the present disclosure is described in further detail below with reference to the drawings.

Referring to FIG. 1, a substrate 100 is provided. the substrate 100 includes shallow trench isolation (STI) structures 110, active areas 120 and word-line structures 130.

The material of the substrate 100 may include silicon, silicon carbide, gallium arsenide, aluminum nitride or zinc oxide, etc. In this embodiment, the substrate 100 is made of silicon. The use of silicon as the substrate 100 in this embodiment is to facilitate the understanding of the subsequent forming method by those skilled in the art, rather than to constitute a limitation. In the actual application process, the appropriate material of the substrate may be selected according to needs.

Multiple active areas 120 are arranged in parallel and spaced apart in the substrate 100. It should be noted that the substrate 100 is also provided with other memory structures other than the STI structures 110, the active areas 120 and the word-line structures 130. Since other memory structures are not related to the core technology of the present disclosure, they are not repeated here. Those skilled in the art may understand that there are other memory structures other than the STI structures 110, the active areas 120 and the word-line structures 130 in the substrate 100 for normal operation of the memory.

The method for forming a semiconductor structure provided in this embodiment is described in detail with reference to an AA1 section and a BB1 section. The AA1 section is in an extension direction of a bit-line structure, and the BB1 section is in an extension direction of the word-line structure. The word-line structure 130 is a buried word-line structure in the substrate 100. The word-line structure 103 passes through the active areas 120 and the STI structures 110 at intervals. In a schematic view of the AA1 section (shown in FIG. 2), the word-line structure 130 is located in the STI structure 110. It should be noted that in other schematic sectional views of the substrate 100, the word-line structure 130 may be located in the active area 120.

Figure 2:
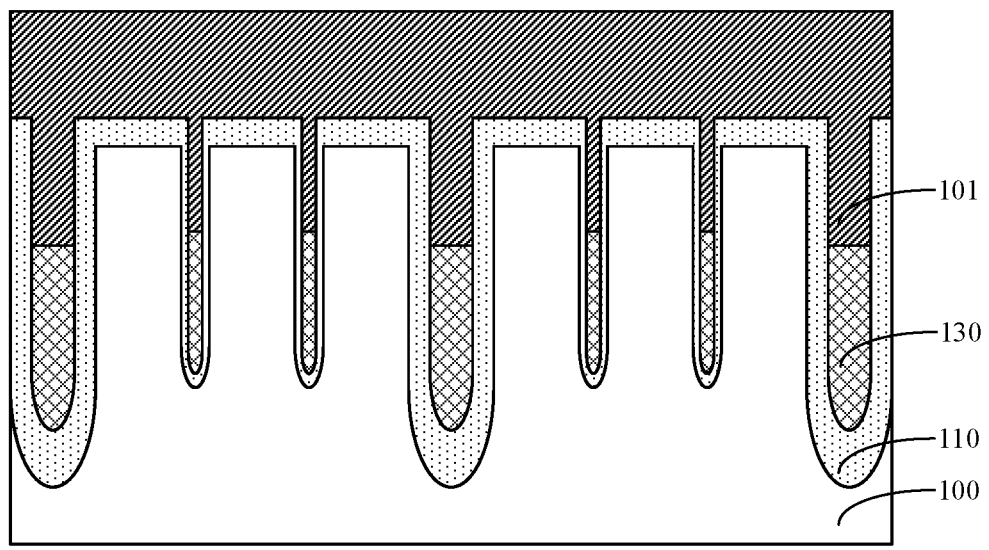
FIGS. 2, 4, 6, 8, 10, 12, 14, 16, 18, 20, 22 and 24 are sectional views taken along AA1 direction, illustrating structures obtained by implementing various steps of a method for forming a semiconductor structure according to the first embodiment of the present disclosure.
Figure 3:
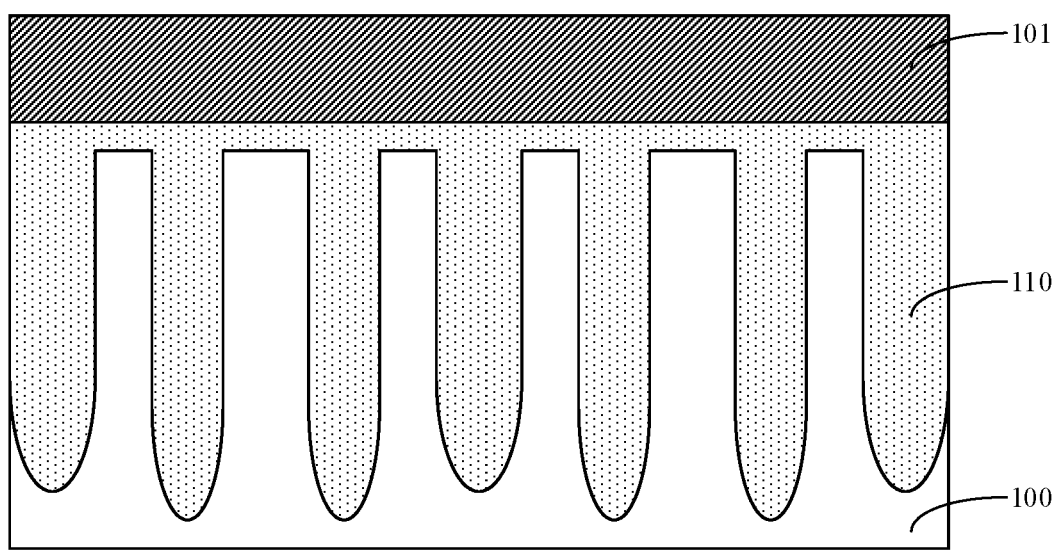
FIGS. 3, 5, 7, 9, 11, 13, 15, 17, 19, 21, 23 and 25 are sectional views taken along BB1 direction, illustrating structures obtained by implementing various steps of a method for forming a semiconductor structure according to the first embodiment of the present disclosure.

Referring to FIGS. 2 and 3, a dielectric layer 101 is formed on a surface of the substrate 100. Referring to FIG. 2, part of the dielectric layer 101 also covers the word-line structure 130, which is configured to electrically isolate the word-line structure 130 from a conductive structure on the top of the substrate 100.

Figure 4:
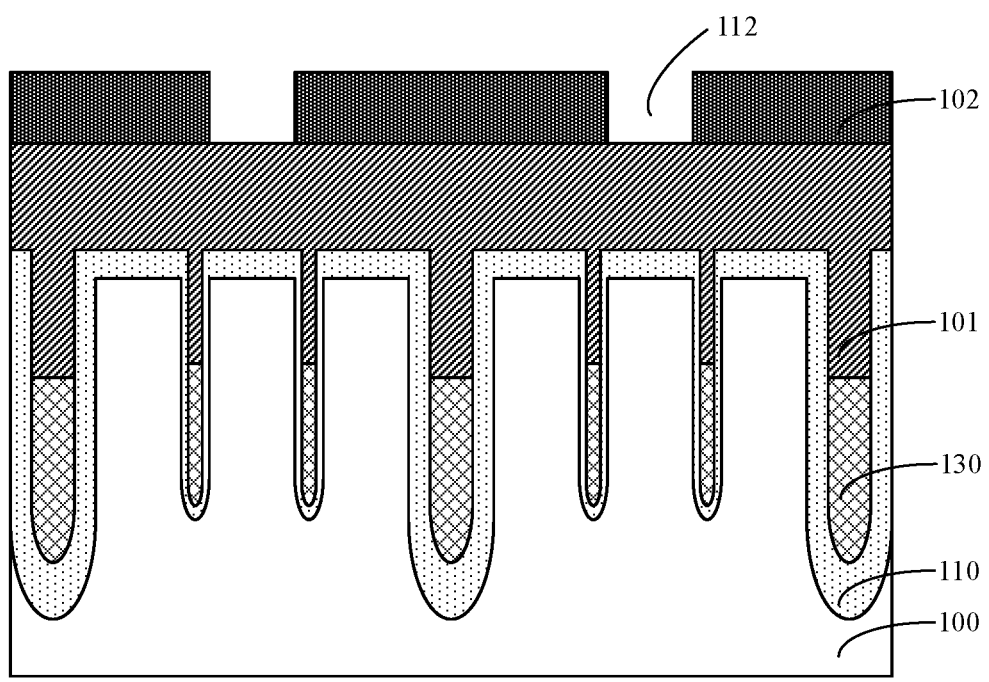
Figure 5:
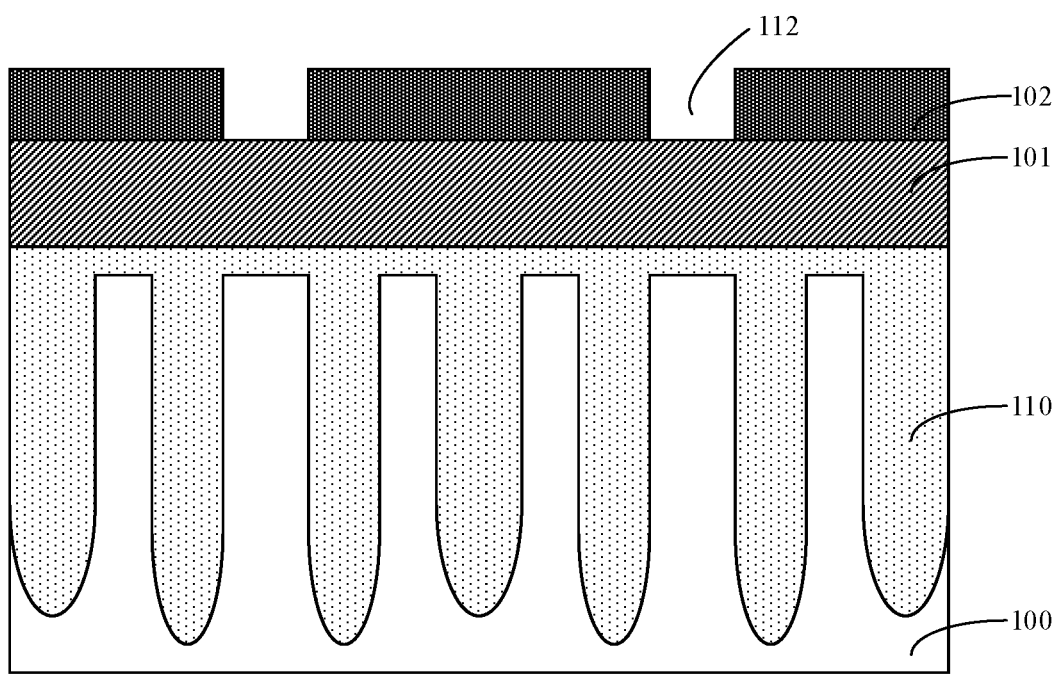

Referring to FIGS. 4 and 5, a mask layer 102 is formed on a surface of the dielectric layer 101. The mask layer 102 is arranged with a first opening 112 penetrating the thickness of the mask layer 102. The mask layer 102 and the first opening 112 are used to define the position of a bit-line contact opening.

In an example, the first opening 112 penetrating the thickness of the mask layer 102 is formed as follows. A patterned photoresist is formed on the top of the mask layer 102, and the first opening 112 penetrating the thickness of the mask layer 102 is formed according to the patterned photoresist. In addition, it should be noted that, in this embodiment, the mask layer 102 has a single-layer structure. In other embodiments, the mask layer may also have a multi-layer structure.

Referring to FIGS. 6 to 9, a first barrier layer 103 is formed on a sidewall of the first opening 112, and the first barrier layer 103 surrounds and forms a second opening 122.

Figure 6:
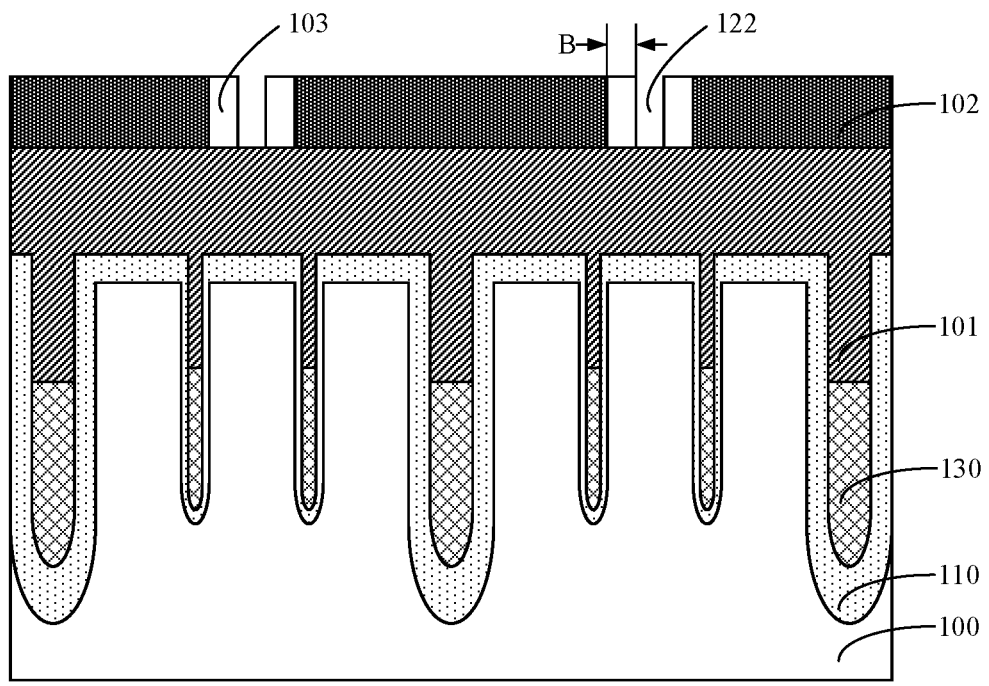
Figure 7:
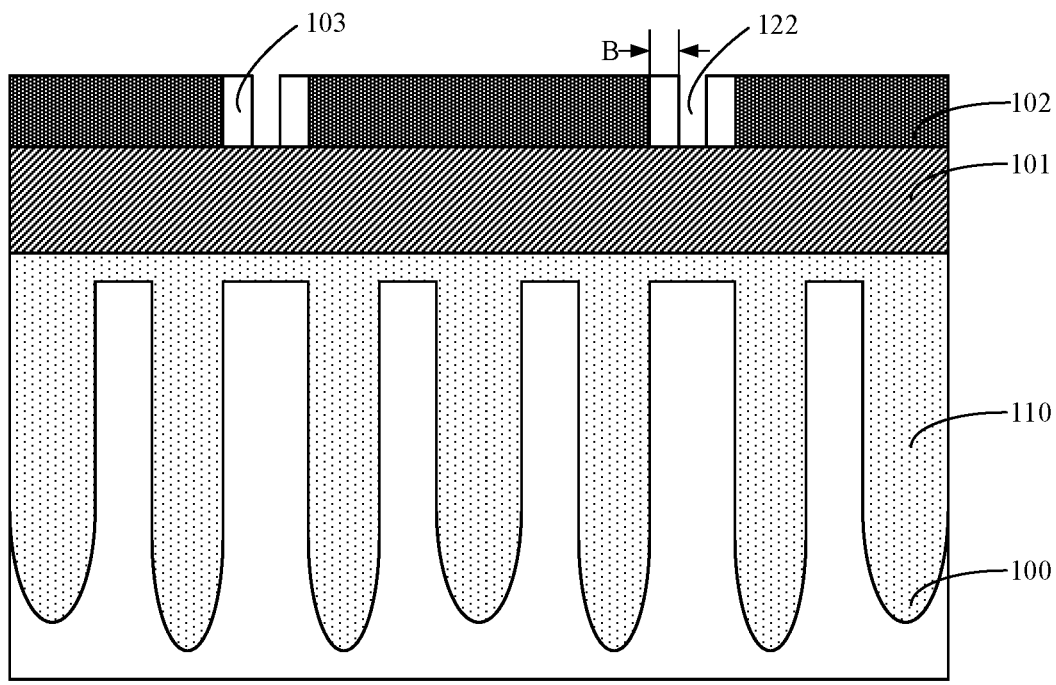

In an example, referring to FIGS. 6 and 7, the first barrier layer 103 is formed on the sidewall of the first opening 112 as follows. A first barrier film (not shown in the figure) is formed, which covers a top surface of the mask layer 102 and covers the sidewall and bottom of the first opening 112. The first barrier film (not shown in the figure) surrounds and forms the second opening 122. The width of the second opening 122 is less than the width of the first opening 112 in a direction parallel to the surface of the substrate. The first barrier film (not shown in the figure) on the top surface of the mask layer 102 and on the bottom of the first opening 112 (not shown in the figure) is removed to form the first barrier layer 103.

Figure 8:
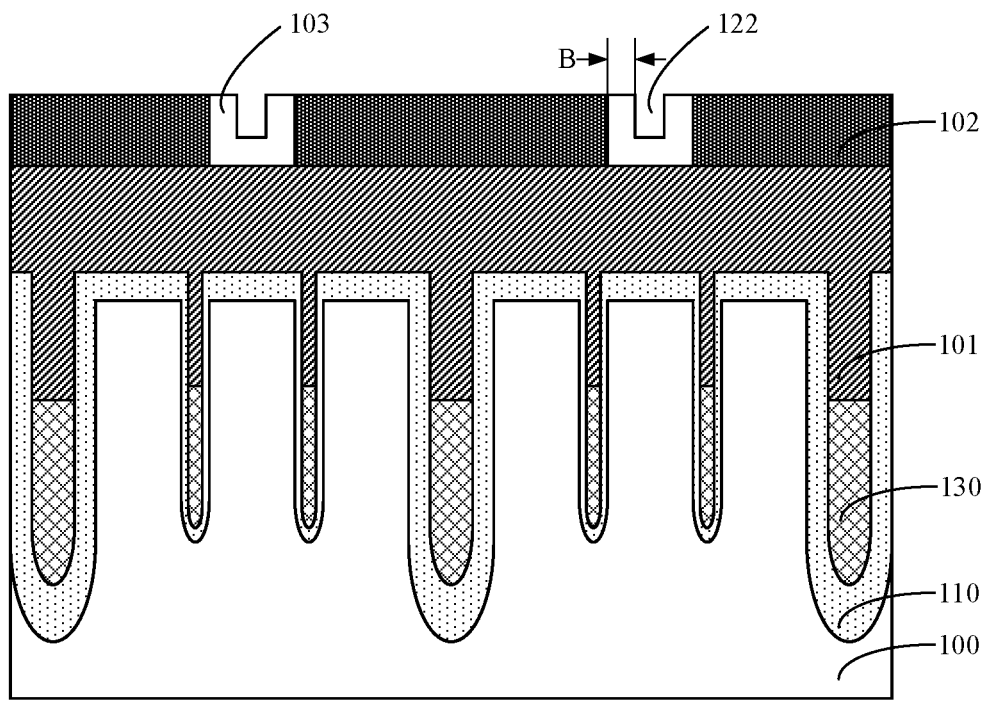
Figure 9:
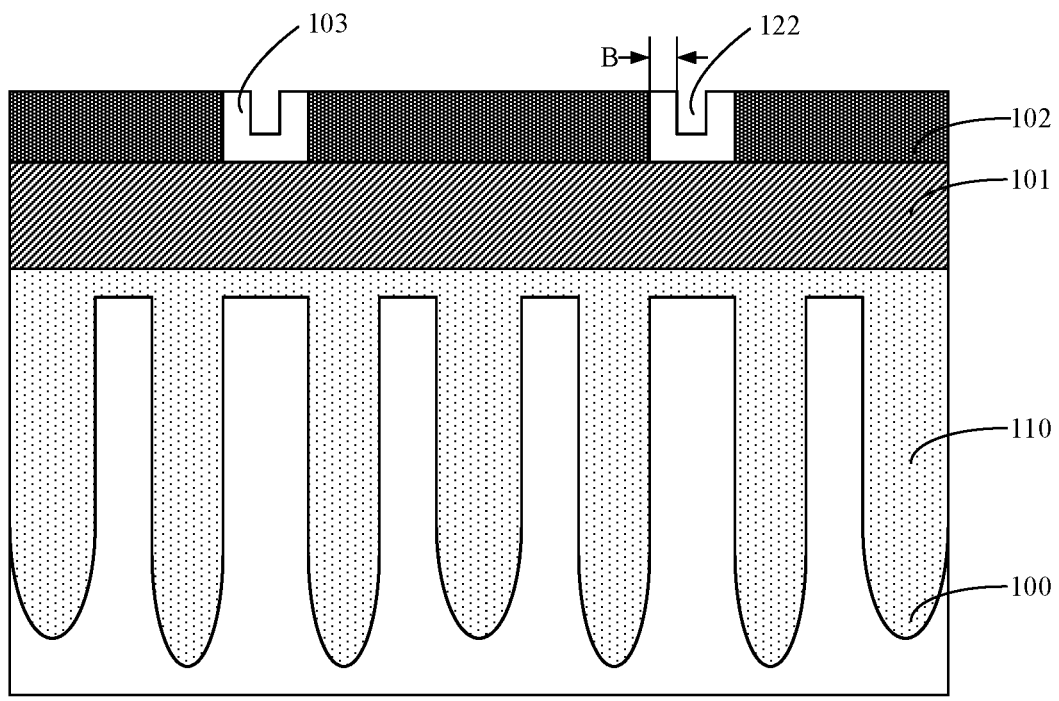

In an example, referring to FIGS. 8 and 9, the first barrier layer 103 is also located on the bottom of the first opening 112. In this case, the first barrier layer 103 is formed on the sidewall of the first opening 112 as follows. A first barrier film (not shown in the figure) is formed, which covers a top surface of the mask layer 102 and covers the sidewall and bottom of the first opening 112. The first barrier film (not shown in the figure) surrounds and forms the second opening 122. The width of the second opening 122 is less than the width of the first opening 112 in a direction parallel to the surface of the substrate. The first barrier film (not shown in the figure) on the top surface of the mask layer 102 is removed to form the first barrier layer 103.

In this embodiment, the width B of the first barrier layer 103 in the direction parallel to the surface of the substrate 100 is 5 nm to 20 nm, for example, 8 nm, 11 nm, 14 nm or 17 nm. If the width of the first barrier layer 103 is less than 5 nm, the size of a concave region of the bit-line contact opening formed subsequently by etching the first barrier layer 103 may be too small. As a result, when the bit-line contact opening is filled to form the bit-line contact structure, the bit-line contact structure will not be able to completely fill the concave region, thereby leading to a filling defect in the bit-line contact structure. If the width of the first barrier layer 103 is greater than 20 nm, the size of a second barrier layer formed by filling the gap of the first barrier layer 103 may be too small, which may result in a too small concave region of the bit-line contact opening formed by etching the second barrier layer. Consequently, when the bit-line contact opening is filled to form the bit-line contact structure, the bit-line contact structure will not be able to completely fill the concave region, thereby leading to a defect in the semiconductor structure.

Figure 10:
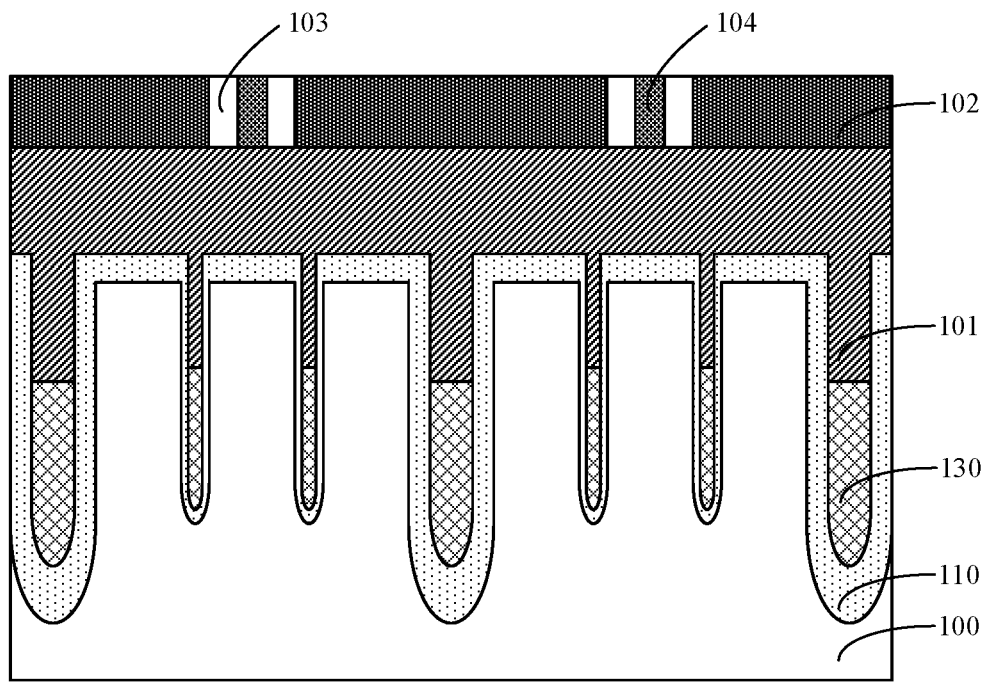
Figure 11:
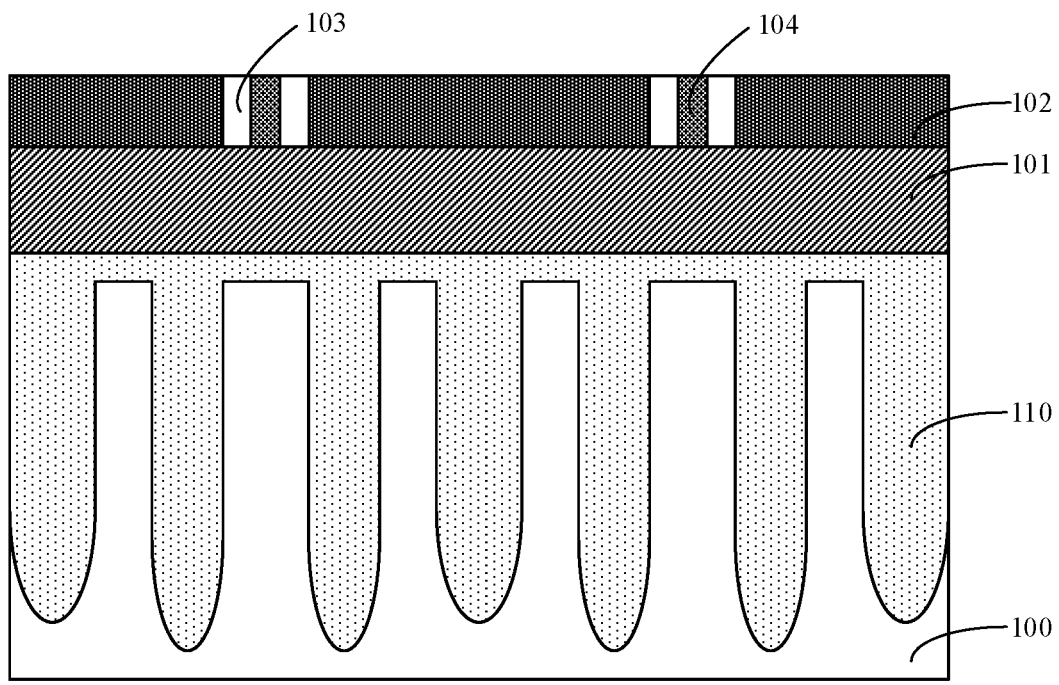

Referring to FIGS. 10 and 11, a second barrier layer 104 filling the second opening 122 (shown in FIG. 6) is formed.

In an example, the second barrier layer 104 filling the second opening 122 (shown in FIG. 6) is formed as follows. A second barrier film (not shown in the figure) filling the second opening 122 (shown in FIG. 6) and covering the first barrier layer 103 is formed. There is an etching selection ratio of a material of the second barrier film (not shown in the figure) to a material of the first barrier layer 103. The second barrier film (not shown in the figure) higher than the first barrier layer 103 is removed, and the remaining second barrier film (not shown in the figure) is taken as the second barrier layer 104.

In an example, the etching selection ratio of the first barrier layer 103 to the second barrier layer 104 is 1:1.1 to 1:3. In another example, the etching selection ratio of the first barrier layer 103 to the second barrier layer 104 is 1.1:1 to 3:1. That is, there is an etching selection ratio of the first barrier layer 103 to the second barrier layer 104. the etched rate of the first barrier layer 103 is greater than that of the second barrier layer 104, or the etched rate of the first barrier layer 103 is less than the etched rate of the second barrier layer 104.

Referring to FIGS. 12 to 25, the first barrier layer 103 and the second barrier layer 104 are removed by a first etching process until the first barrier layer 103 or the second barrier layer 104 is completely removed, where the rate of the first etching process to remove the first barrier layer 103 is different from that to remove the second barrier layer 104. The dielectric layer 101 exposed by the first opening 112 and part of the substrate 100 exposed by the first opening are removed to form a bit-line contact opening 105, where the bottom of the bit-line contact opening 105 is arranged with a convex region 115 and a concave region 125, and the convex region 115 and the concave region 125 have a height difference.

In an example, the depth of the bit-line contact opening 105 in a direction perpendicular to the surface of the substrate is 20 nm to 40 nm, for example, 25 nm, 30 nm or 35 nm.

In this embodiment, the convex region 115 and the concave region 125 have a height difference of 1 nm to 15 nm, for example, 3 nm, 5 nm, 7 nm, 9 nm, 11 nm or 13 nm. By controlling the height difference between the convex region 115 and the concave region 125, the change of the bottom area of the bit-line contact opening 105 can be controlled. In addition, if the height difference between the convex region 115 and the concave region 125 is less than 1 nm, the increase in the bottom area of the bit-line contact opening 105 is negligible. Therefore, the decrease in the contact resistance of the bit-line contact structure formed by filling the bit-line contact opening 105 is negligible. That is, the contact resistance of the bit-line contact structure is still large, which will affect the electrical performance of the semiconductor structure. If the height difference between the convex region 115 and the concave region 125 is greater than 15 nm, the aspect ratio of the gap between the concave region 125 and the convex region 115 is large. Thus, the bit-line contact structure formed subsequently by filling the bit-line contact opening 105 will not be able to completely fill, which will result in a structural defect, thereby affecting the yield of the semiconductor structure.

The first barrier layer 103 and the second barrier layer 104 are removed by the first etching process until the first barrier layer 103 or the second barrier layer 104 is completely removed. Specifically, the first barrier layer 103 and the second barrier layer 104 are removed by the first etching process until one of the first barrier layer 103 and the second barrier layer with a faster etched rate is completely removed. Alternatively, the first barrier layer 103 and the second barrier layer 104 are removed by the first etching process until one of the first barrier layer 103 and the second barrier layer 104 with a slower etched rate is completely removed.

In a specific example, the etched rate of the second barrier layer 104 is greater than that of the first barrier layer 103. Referring to FIGS. 12 to 19, the first barrier layer 103 and the second barrier layer 104 are removed by the first etching process until one of the first barrier layer 103 and the second barrier layer 104 with a faster etched rate is completely removed.

Figure 12:
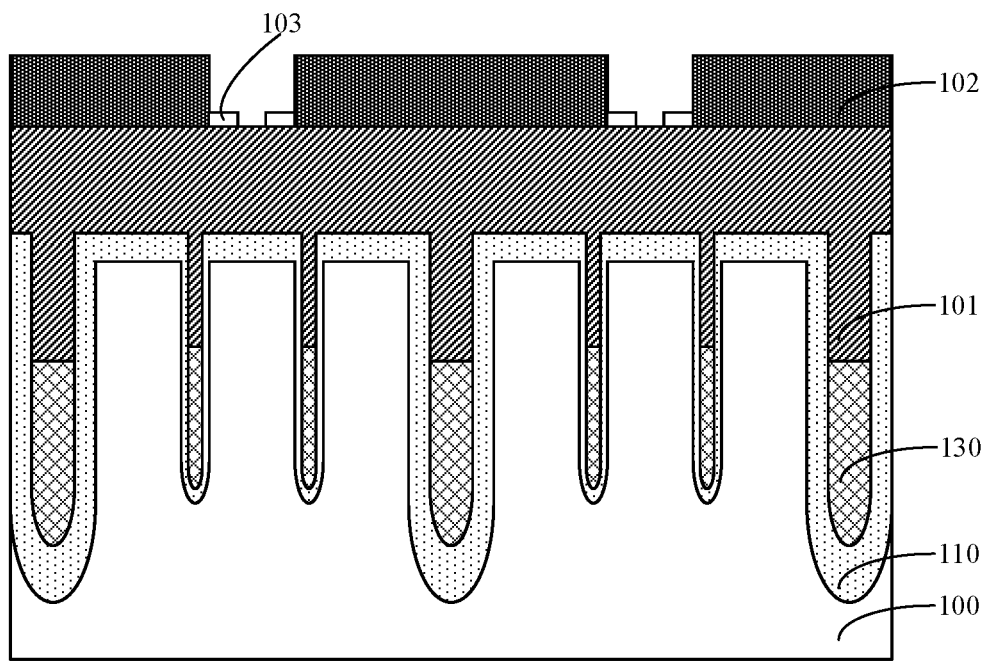
Figure 13:
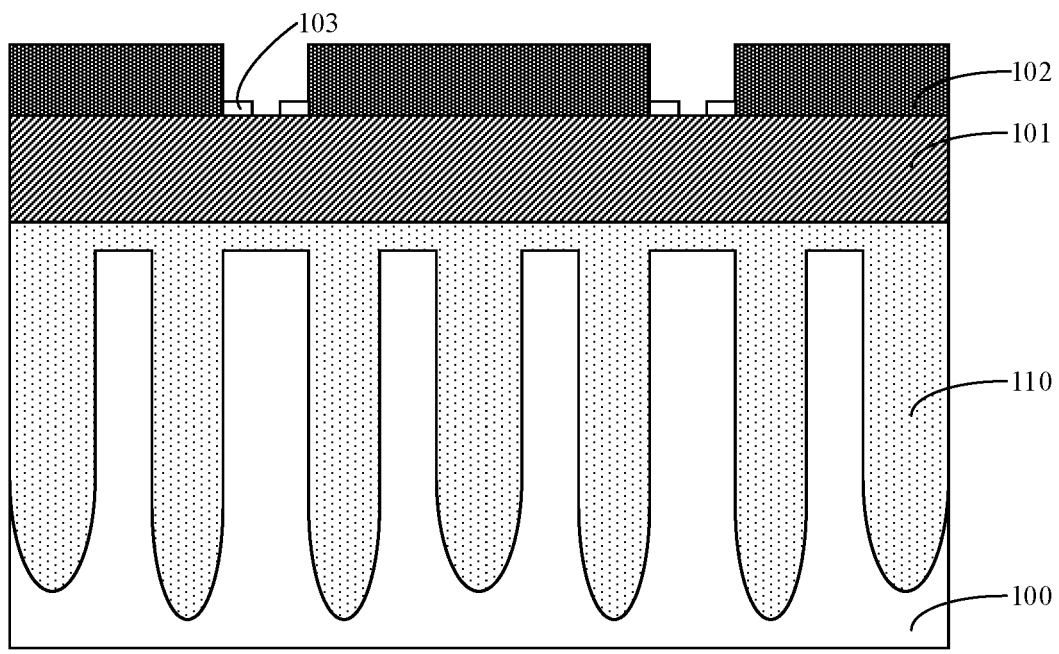

Referring to FIGS. 12 and 13, the first barrier layer 103 and the second barrier layer 104 are simultaneously etched by the first etching process. When the second barrier layer 104 is completely removed, the first etching process is stopped. Since the etched rate of the first barrier layer 103 is less than the etched rate of the second barrier layer 104, part of the first barrier layer 103 remains.

In this embodiment, an etching gas used in the first etching process is a mixed gas which at least includes oxygen and fluorocarbon gas, and the etching time of the first etching process is 20 s to 60 s, for example, 30 s, 40 s or 50 s.

Figure 14:
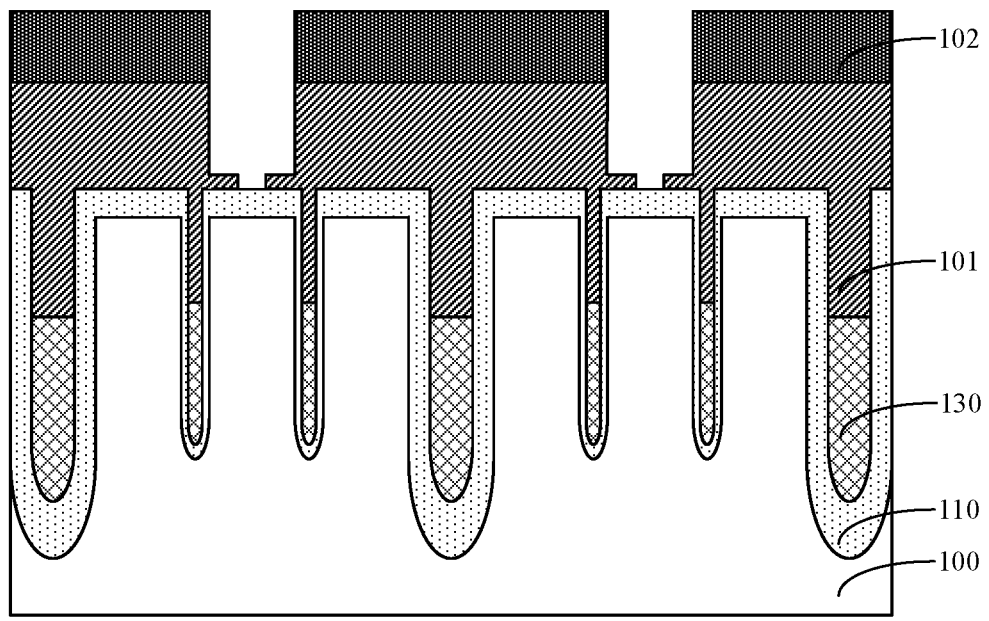
Figure 15:
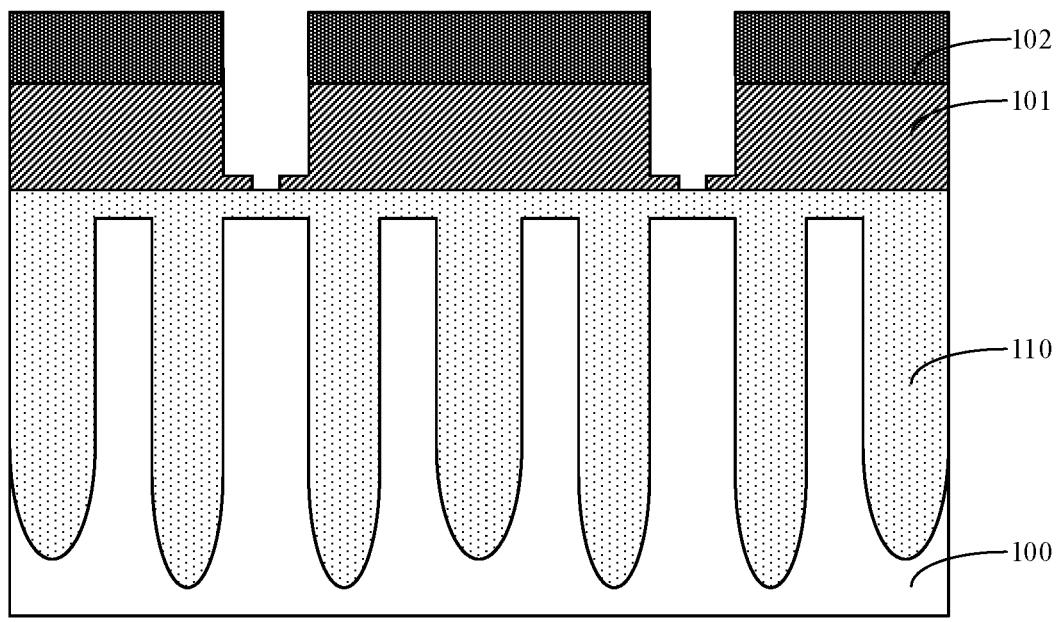

Referring to FIGS. 14 and 15, the first barrier layer 103 or the second barrier layer 104 is etched by a second etching process, and the dielectric layer exposed by the first opening 112 is etched until the substrate 100 is exposed.

In this example, part of the first barrier layer 103 remains after the etching of the first etching process. Therefore, when the second etching process is performed, a middle area on the bottom of the first opening 112 is always lower than an edge area on the bottom of the first opening 112, until the middle on the bottom of the first opening 112 exposes the substrate 100. At this time, part of the dielectric layer 101 in the edge area on the bottom of the first opening 112 remains.

Figure 16:
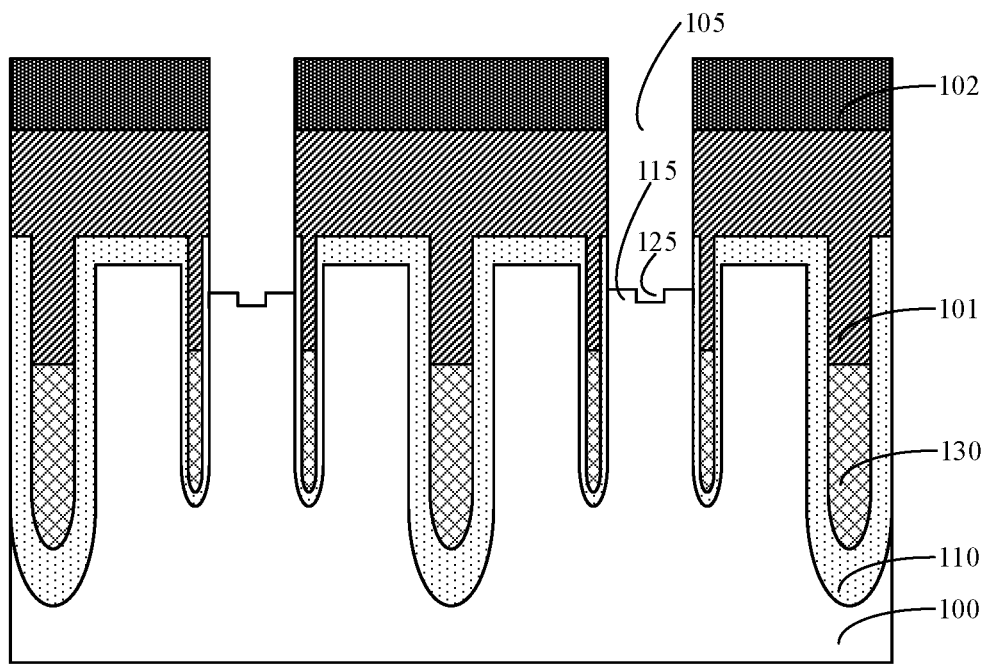
Figure 17:
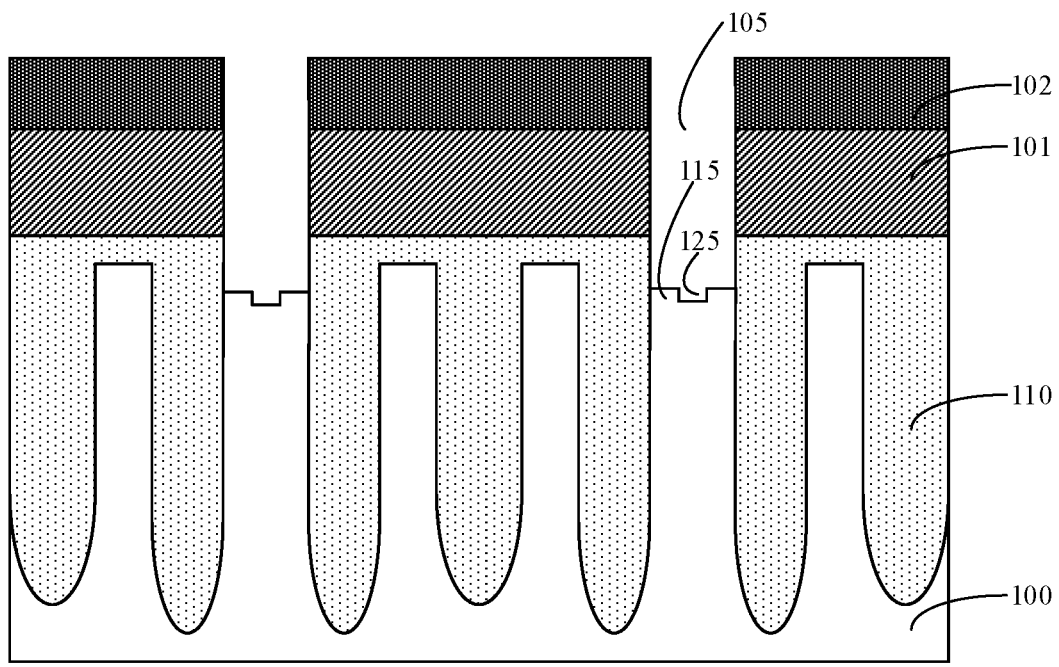

Referring to FIGS. 16 and 17, the substrate 100 is etched by a preset thickness by a third etching process to form the bit-line contact opening 105, wherein the substrate to-be-etched is exposed by the first opening 112.

Part of the edge area on the bottom of the first opening 112 remains after the etching of the second etching process. Therefore, when the third etching process is performed, the middle area on the bottom of the first opening 112 is always lower than the edge area on the bottom of the first opening 112, until the bit-line contact opening 105 is formed. The higher area on the bottom forms the convex region 115, and the lower area on the bottom forms the concave region 125.

Figure 18:
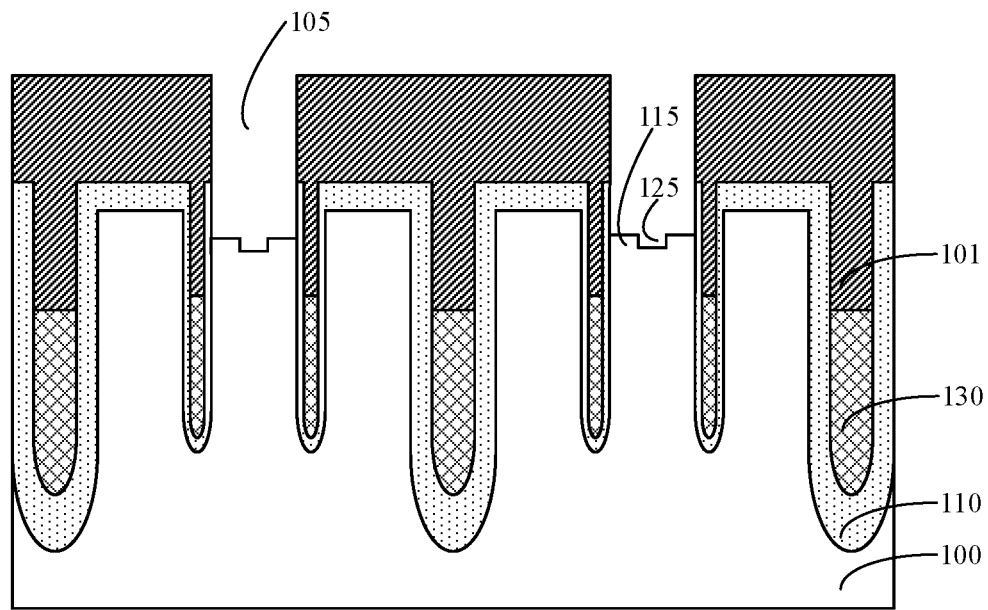
Figure 19:
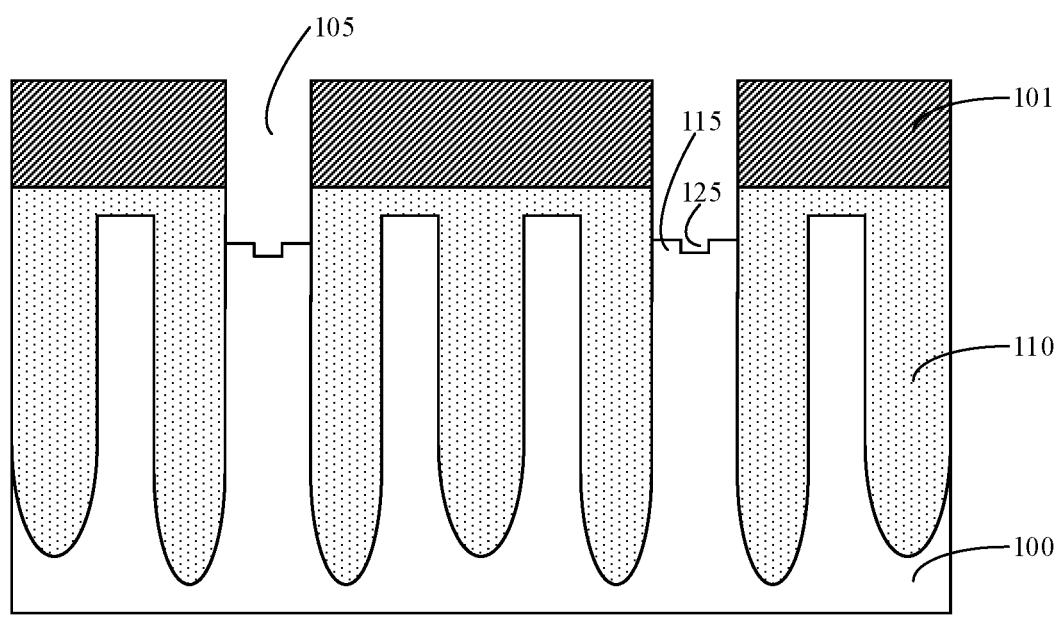

Referring to FIGS. 18 and 19, the mask layer 102 is removed.

It should be noted that in the above etching example, the etched rate of the second barrier layer 104 is greater than that of the first barrier layer 103. In other embodiments, the above etching example is also applicable to the case where the etched rate of the second barrier layer 104 is less than the etched rate of the first barrier layer 103.

In another specific example, the etched rate of the second barrier layer 104 is less than the etched rate of the first barrier layer 103. Referring to FIGS. 20 to 25, the first barrier layer 103 and the second barrier layer 104 are removed by the first etching process until one of the first barrier layer 103 and the second barrier layer 104 with a slower etched rate is completely removed.

Figure 20:
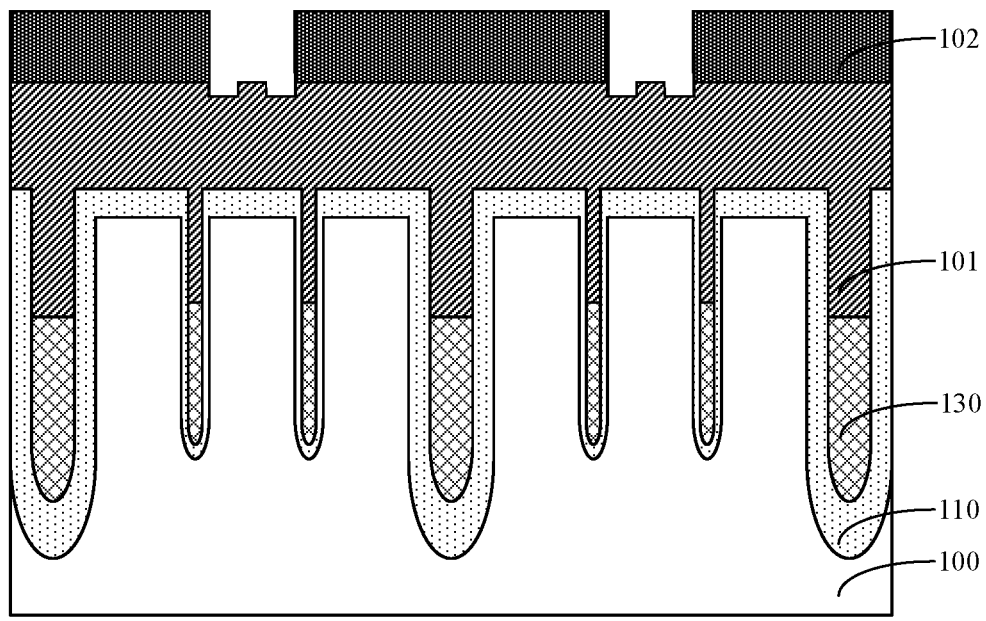
Figure 21:
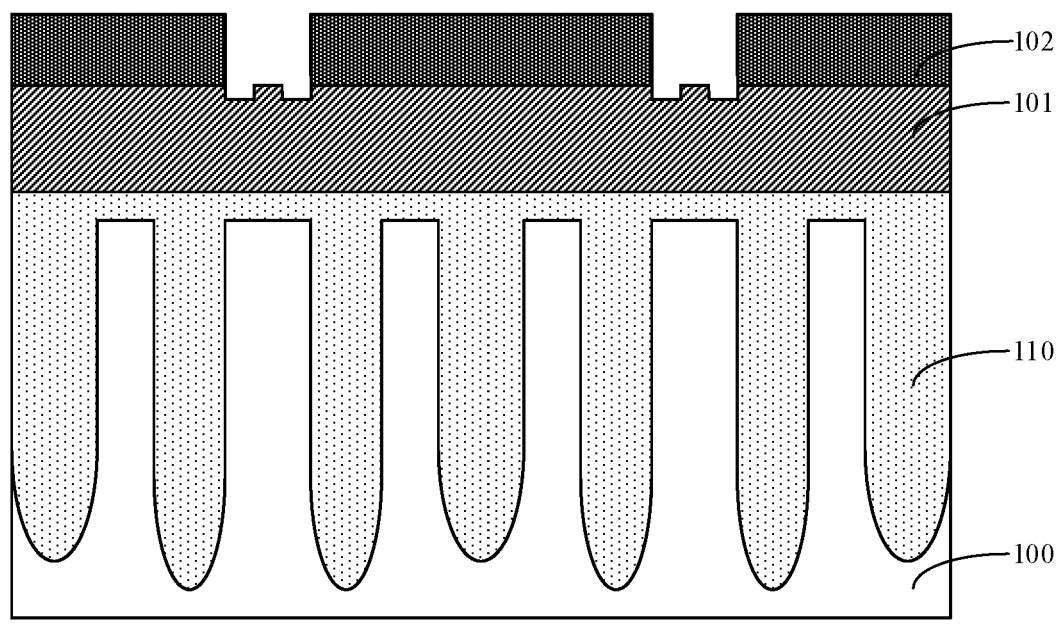

Referring to FIGS. 20 and 21, the first barrier layer 103 and the second barrier layer 104 are simultaneously etched by the first etching process. When the second barrier layer 104 is completely removed, the first etching process is stopped. Since the etched rate of the first barrier layer 103 is greater than that of the second barrier layer 104, the dielectric layer 101 on the bottom of the first barrier layer 103 is over-etched. That is, when the first barrier layer 103 and the second barrier layer 104 are removed, part of the dielectric layer 101 is removed, and the etched dielectric layer 101 is located on the bottom of one of the first barrier layer 103 and the second barrier layer 104 with a faster etched rate.

In this embodiment, an etching gas used in the first etching process is a mixed gas which includes at least oxygen and fluorocarbon gas, and the etching time of the first etching process is 20 s to 60 s, for example, 30 s, 40 s or 50 s.

Figure 22:
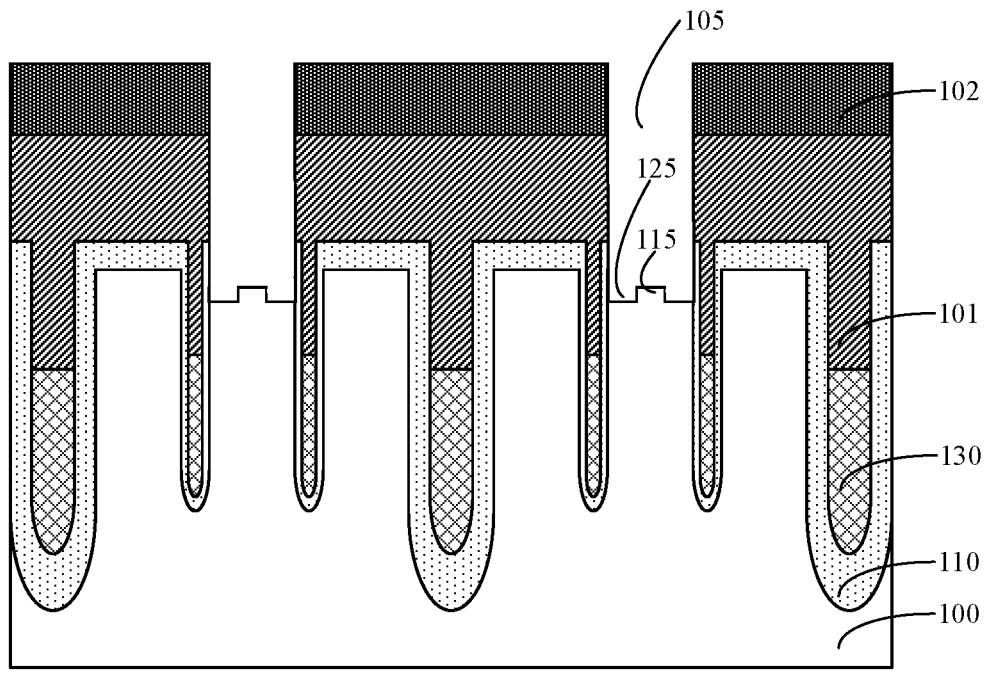
Figure 23:
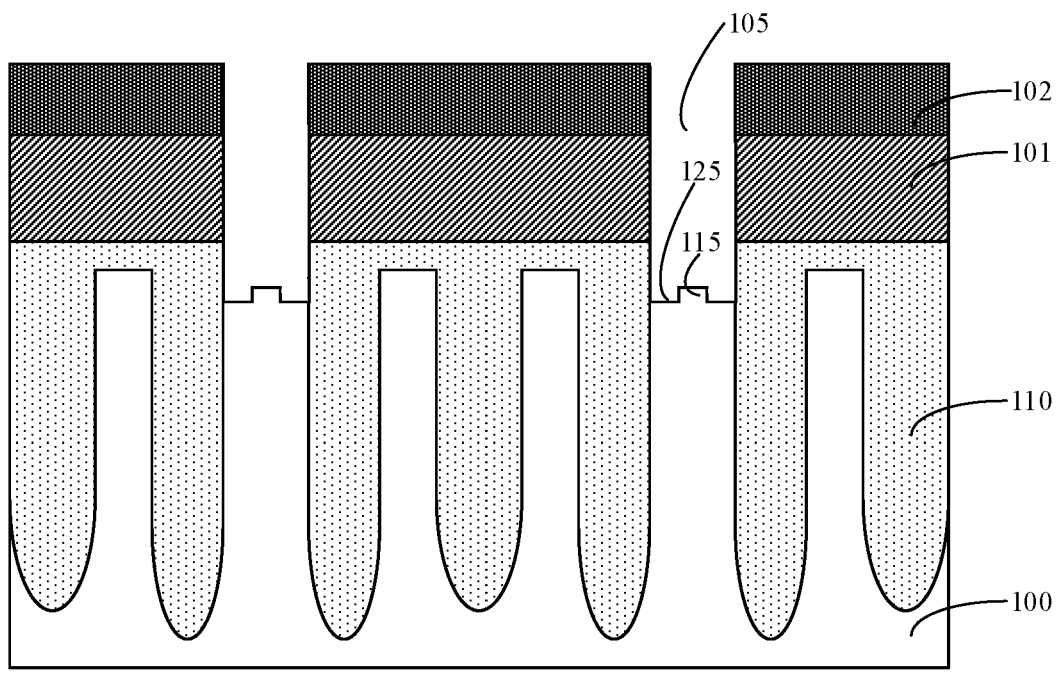

Referring to FIGS. 22 and 23, the dielectric layer 101 exposed by the first opening 112 is etched by the second etching process until the substrate 100 is exposed.

The second etching process continues to etch the dielectric layer 101. During the etching process of the dielectric layer 101, the edge area on the bottom of the first opening 112 is always lower than the middle area on the bottom of the first opening 112. After the dielectric layer 101 in the edge area on the bottom of the first opening 112 is completely etched, part of the dielectric layer 101 in the middle area on the bottom of the first opening 112 remains. After the dielectric layer 101 in the middle area on the bottom of the first opening 112 is completely etched, the substrate 100 in the edge area on the bottom of the first opening 112 is over-etched.

The substrate 100 is etched by the third etching process to form the bit-line contact opening 105, wherein the substrate to-be-etched is exposed by the first opening 112.

The substrate 100 in the edge area of the bottom of the first opening 112 is over-etched, when the first opening 112 is etched by the second etching process. Therefore, when the substrate 100 by a preset thickness is etched by the third etching process, the middle area on the bottom of the first opening 112 is always higher than the edge area on the bottom of the first opening 112, until the bit-line contact opening 105 is formed. The higher area on the bottom forms the convex region 115, and the lower area on the bottom forms the concave region 125.

Figure 24:
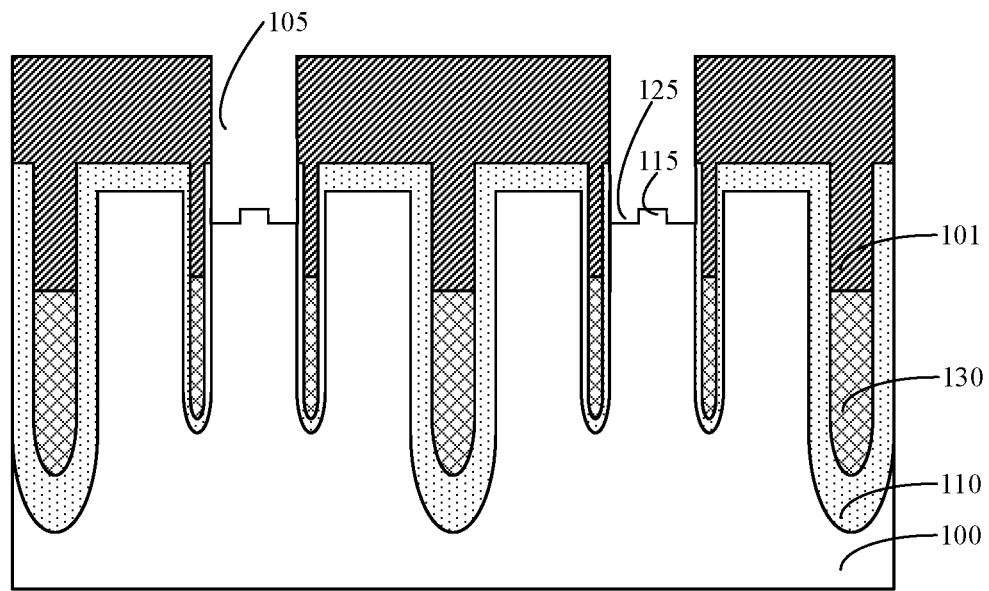
Figure 25:
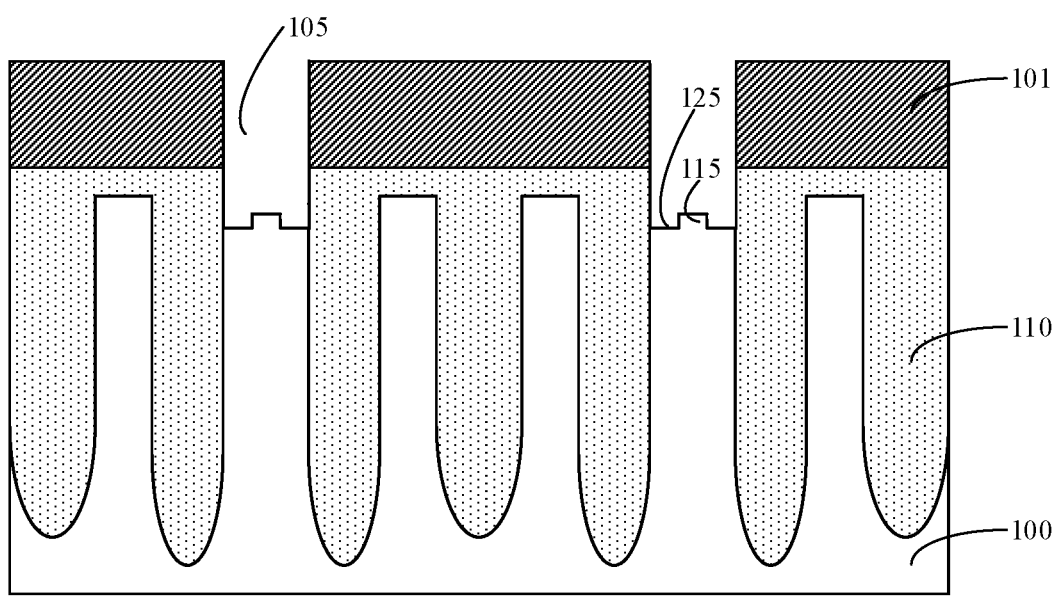

Referring to FIGS. 24 and 25, the mask layer 102 is removed.

It should be noted that in the above etching example, the etched rate of the second barrier layer 104 is less than the etched rate of the first barrier layer 103. In other embodiments, the above etching example is also applicable to the case where the etched rate of the second barrier layer 104 is greater than that of the first barrier layer 103.

It should be noted that, in this embodiment, by forming the raised-recessed opening 105 of the bit-line structure between two word-line structures 130, the contact area of the bit-line contact structure formed subsequently is increased. Since the formation area of the word-line structure 130 is not occupied, the performance of the word-line structure 130 will not be affected.

Compared to the related art, in the present disclosure, the bit-line contact opening is arranged with a concave region and a convex region, which increase the bottom area of the bit-line contact opening. In this way, the contact area of the bit-line contact structure formed subsequently by filling the bit-line contact opening is increased, thereby reducing the contact resistance of the bit-line contact structure formed subsequently.

The divisions of the various steps above are intended for clear description. In implementation, all these steps may be merged into one step or some of them may be split into multiple steps, but the merged and split steps with the same logical relationship as the original steps should fall within the protection scope of the present disclosure. Insignificant modifications made and designs introduced to the process flow without changing the core design of the process flow should also fall within the protection scope of the present disclosure.

Another embodiment of the present disclosure relates to a semiconductor structure. The semiconductor structure includes: a substrate and a dielectric layer. the substrate is arranged with an active area and a first contact opening exposing the active area. The bottom of the first contact opening is arranged with a first area and a second area, and the first area and the second area have a height difference. The dielectric layer is located on a surface of the substrate. The dielectric layer is arranged with a second contact opening penetrating the dielectric layer. The second contact opening exposes the first contact opening, and the second contact opening and the first contact opening define a bit-line contact opening.

FIGS. 18 and 19 are views illustrating the structure of the semiconductor structure provided in this embodiment. The semiconductor structure provided in this embodiment is described in detail below with reference to the drawings, and the details the same as or corresponding to those mentioned in the above embodiment will not be repeated here.

Referring to FIGS. 1, 18 and 19, the semiconductor structure includes a substrate 100 and a dielectric layer 101.

The substrate 100 is arranged with active areas 120 and first contact openings (not shown in the figure) exposing the active areas 120.

The material of the substrate 100 may include silicon, silicon carbide, gallium arsenide, aluminum nitride or zinc oxide, etc. In this embodiment, the substrate 100 is made of silicon. The use of silicon as the substrate 100 in this embodiment is to facilitate the understanding of the subsequent forming method by those skilled in the art, rather than to constitute a limitation. In the actual application process, the appropriate material of the substrate may be selected according to needs.

Multiple active areas 120 are arranged in parallel and spaced apart in the substrate 100. It should be noted that the substrate 100 is also provided with other memory structures other than STI structures 110, the active areas 120 and word-line structures 130. Since other memory structures are not related to the core technology of the present disclosure, they are not repeated here. Those skilled in the art may understand that there are other memory structures other than the STI structures 110, the active areas 120 and the word-line structures 130 in the substrate 100 for normal operation of the memory.

The dielectric layer 101 is located on a surface of the substrate 100. The dielectric layer 101 is arranged with a second contact opening (not shown in the figure) penetrating the dielectric layer 101. The second contact opening (not shown in the figure) exposes the first contact opening (not shown in the figure). The second contact opening (not shown in the figure) and the first contact opening (not shown in the figure) define a bit-line contact opening 105.

The bottom of the first contact opening (not shown in the figure) is arranged with a first area and a second area, and the first area and the second area have a height difference. That is, the bottom of the bit-line contact opening 105 is arranged with a first area and a second area, and the first area and the second area have a height difference.

In this embodiment, the first area is a convex region 115, the second area is a concave region 125, and the first area surrounds the second area. It should be noted that this embodiment mainly embodies that the bottom of the bit-line contact opening 105 includes a first area and a second area with different heights. In other embodiments, the first area may be a concave region, and the second area may be a convex region. In addition, in other embodiments, the first area and the second area may be spliced on the bottom of the bit-line contact opening.

In this embodiment, the width of the first area in a direction parallel to the surface of the substrate 100 is 5 nm to 20 nm, for example, 8 nm, 11 nm, 14 nm or 17 nm. If the width of the first area is less than 5 nm, the size of the concave region of the bit-line contact opening formed subsequently by etching the first area may be too small. As a result, when the bit-line contact opening is filled to form the bit-line contact structure, the bit-line contact structure will not be able to completely fill the concave region, thereby leading to a filling defect in the bit-line contact structure. If the width of the first area is greater than 20 nm, the size of a second barrier layer formed by filling the gap of the first area may be too small, which may result in a too small concave region of the bit-line contact opening formed by etching the second barrier layer. Consequently, when the bit-line contact opening is filled to form the bit-line contact structure, the bit-line contact structure will not be able to completely fill the concave region, thereby leading to a defect in the semiconductor structure.

In addition, in this embodiment, in a direction perpendicular to the surface of the substrate, the depth of the bit-line contact opening 105 is 20 nm to 40 nm, for example, 25 nm, 30 nm or 35 nm; the first area and the second area have a height difference of 1 nm to 15 nm, for example, 3 nm, 5 nm, 7 nm, 9 nm, 11 nm or 13 nm. By controlling the height difference between the convex region 115 and the concave region 125, the change of the bottom area of the bit-line contact opening 105 can be controlled. In addition, if the height difference between the convex region 115 and the concave region 125 is less than 1 nm, the increase in the bottom area of the bit-line contact opening 105 is negligible. Therefore, the decrease in the contact resistance of the bit-line contact structure formed by filling the bit-line contact opening 105 is negligible. That is, the contact resistance of the bit-line contact structure is still large, which will affect the electrical performance of the semiconductor structure. If the height difference between the convex region 115 and the concave region 125 is greater than 15 nm, the aspect ratio of the gap between the concave region 125 and the convex region 115 is large. Thus, the bit-line contact structure formed subsequently by filling the bit-line contact opening 105 will not be able to completely fill, which will result in a structural defect, thereby affecting the yield of the semiconductor structure.

It should be noted that, in this embodiment, by forming the raised-recessed opening 105 of the bit-line structure between two word-line structures 130, the contact area of the bit-line contact structure formed subsequently is increased. Since the formation area of the word-line structure 130 is not occupied, the performance of the word-line structure 130 will not be affected.

In the present disclosure, the bit-line contact opening is arranged with a concave region and a convex region, which increase the bottom area of the bit-line contact opening. In this way, the contact area of the bit-line contact structure formed subsequently by filling the bit-line contact opening is increased, thereby reducing the contact resistance of the bit-line contact structure formed subsequently.

Since this embodiment corresponds to the first embodiment, this embodiment may be implemented in cooperation with the first embodiment. The related technical details mentioned in the first embodiment are still valid in this embodiment, and the technical effects that may be achieved in the first embodiment may also be achieved in this embodiment, which will not be repeated here. Correspondingly, the related technical details mentioned in this embodiment may also be applied to the first embodiment.

Each embodiment in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or feature may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships according to the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It should be understood that the terms such as "first" and "second" used herein may be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The embodiments of the present disclosure provide a method for forming a semiconductor structure and a semiconductor structure. The bit-line contact opening is arranged with a concave region and a convex region on the bottom, which increase the bottom area of the bit-line contact opening. In this way, the contact area of the bit-line contact structure formed subsequently by filling the bit-line contact opening is increased, thereby reducing the contact resistance of the bit-line contact structure formed subsequently.

What is claimed is:

1. A method for forming a semiconductor structure, comprising:
providing a substrate, and forming a dielectric layer on a surface of the substrate;
forming a mask layer on a surface of the dielectric layer, wherein the mask layer is arranged with a first opening penetrating the mask layer in a thickness direction of the mask layer;
forming a first barrier layer on a sidewall of the first opening, wherein the first barrier layer surrounds and forms a second opening;
forming a second barrier layer filling the second opening;
removing the first barrier layer and the second barrier layer by a first etching process until the first barrier layer or the second barrier layer is completely removed, wherein a removed rate of the first barrier layer by the first etching process is different from a removed rate of the second barrier layer by the first etching process; and
removing the dielectric layer exposed by the first opening and part of the substrate exposed by the first opening, to form a bit-line contact opening, wherein a bottom of the bit-line contact opening is arranged with a convex region and a concave region, and the convex region and the concave region have a height difference;
wherein, the convex region surrounds the concave region, or, the concave region surrounds the convex region;
wherein the removing the first barrier layer and the second barrier layer by a first etching process until the first barrier layer or the second barrier layer is completely removed comprises:
removing the first barrier layer and the second barrier layer by the first etching process until one of the first barrier layer and the second barrier layer with a faster etched rate is completely removed;
wherein the removing the first barrier layer and the second barrier layer by the first etching process until one of the first barrier layer and the second barrier layer with a faster etched rate is completely removed comprises:
removing the dielectric layer exposed by the first opening and part of the substrate exposed by the first opening to form a bit-line contact opening, comprising:
etching a remaining first barrier layer or a remaining second barrier layer by a second etching process, and etching the dielectric layer exposed by the first opening until the substrate is exposed; and
etching the substrate by a preset thickness by a third etching process to form the bit-line contact opening, wherein the substrate to-be-etched is exposed by the first opening.

2. The method for forming a semiconductor structure according to claim 1, wherein the height difference is 1 nm to 15 nm.

3. The method for forming a semiconductor structure according to claim 1, wherein an etching gas used in the first etching process is a mixed gas comprising at least oxygen and fluorocarbon gas.

4. The method for forming a semiconductor structure according to claim 3, wherein an etching time of the first etching process is 20 s to 60 s.

5. The method for forming a semiconductor structure according to claim 1, wherein
the first barrier layer is also located on a bottom of the first opening;
the forming a first barrier layer on a sidewall of the first opening comprises:
forming a first barrier film, wherein the first barrier film covers a top surface of the mask layer and covers the sidewall and the bottom of the first opening, the first barrier film surrounds and forms the second opening; a width of the second opening is less than a width of the first opening in a direction parallel to the surface of the substrate; and
removing the first barrier film on the top surface of the mask layer to form the first barrier layer.

6. The method for forming a semiconductor structure according to claim 1, wherein a width of the first barrier layer is 5 nm to 20 nm, in a direction parallel to the surface of the substrate.

7. The method for forming a semiconductor structure according to claim 1, wherein the forming a second barrier layer filling the second opening comprises:
forming a second barrier film filling the second opening and covering the first barrier layer, wherein there is an etching selection ratio of a material of the second barrier film to a material of the first barrier layer; and
removing the second barrier film higher than the first barrier layer, and taking a remaining second barrier film as the second barrier layer.

8. The method for forming a semiconductor structure according to claim 7, wherein the etching selection ratio of the first barrier layer to the second barrier layer is 1:1.1 to 1:3, or 1.1:1 to 3:1.

* * * * *